United States Patent
Fukunaga

(10) Patent No.: US 7,329,577 B2
(45) Date of Patent: Feb. 12, 2008

(54) METHOD OF MANUFACTURING NONVOLATILE SEMICONDUCTOR STORAGE DEVICE

(75) Inventor: Hiroyuki Fukunaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/761,223

(22) Filed: Jan. 22, 2004

(65) Prior Publication Data

US 2005/0164453 A1    Jul. 28, 2005

(51) Int. Cl.
*H01L 21/336*    (2006.01)

(52) U.S. Cl. .................. 438/257; 257/E21.68

(58) Field of Classification Search ........ 438/257–267; 257/314–320, E21.68, E21.681
See application file for complete search history.

(56) References Cited

U.S. PATENT DOCUMENTS

| | | | | |
|---|---|---|---|---|
| 4,514,897 A | * | 5/1985 | Chiu et al. | 438/257 |
| 5,017,979 A | * | 5/1991 | Fujii et al. | 257/319 |
| 5,208,175 A | * | 5/1993 | Choi et al. | 438/261 |
| 5,510,284 A | * | 4/1996 | Yamauchi | 438/257 |
| 5,888,870 A | * | 3/1999 | Gardner et al. | 438/261 |
| 6,114,230 A |   | 9/2000 | Chang et al. | |
| 6,313,498 B1 |   | 11/2001 | Chen | |

FOREIGN PATENT DOCUMENTS

| | | |
|---|---|---|
| JP | 62-131582 | 6/1987 |
| JP | 63202029 | 8/1988 |
| JP | 05-175508 | 7/1993 |
| JP | 5218440 | 8/1993 |
| JP | 06-188431 | 7/1994 |

\* cited by examiner

*Primary Examiner*—Brook Kebede
(74) *Attorney, Agent, or Firm*—Volentine & Whitt, P.L.L.C.

(57) ABSTRACT

In a method of manufacturing a nonvolatile semiconductor storage device, an element isolation region is formed in a semiconductor substrate, a tunnel oxide film and a polysilicon layer are successively formed on the semiconductor substrate, and nitrogen ions are thereafter implanted into the front surface of the polysilicon layer so as to stay in the front surface only. The polysilicon layer is patterned to form a floating gate, which is then thermally oxidized to form an inter-gate insulating film. Since thermal oxidation is suppressed by nitrogen ions, the inter-gate insulating film is thicker at the side surfaces of the floating gate than at the front surface. The inter-gate insulating film at the edge of the floating gate can be formed as designed, so that the storage device is free from bad influence during electrical programming and erasing, and can retain charge longer.

5 Claims, 5 Drawing Sheets

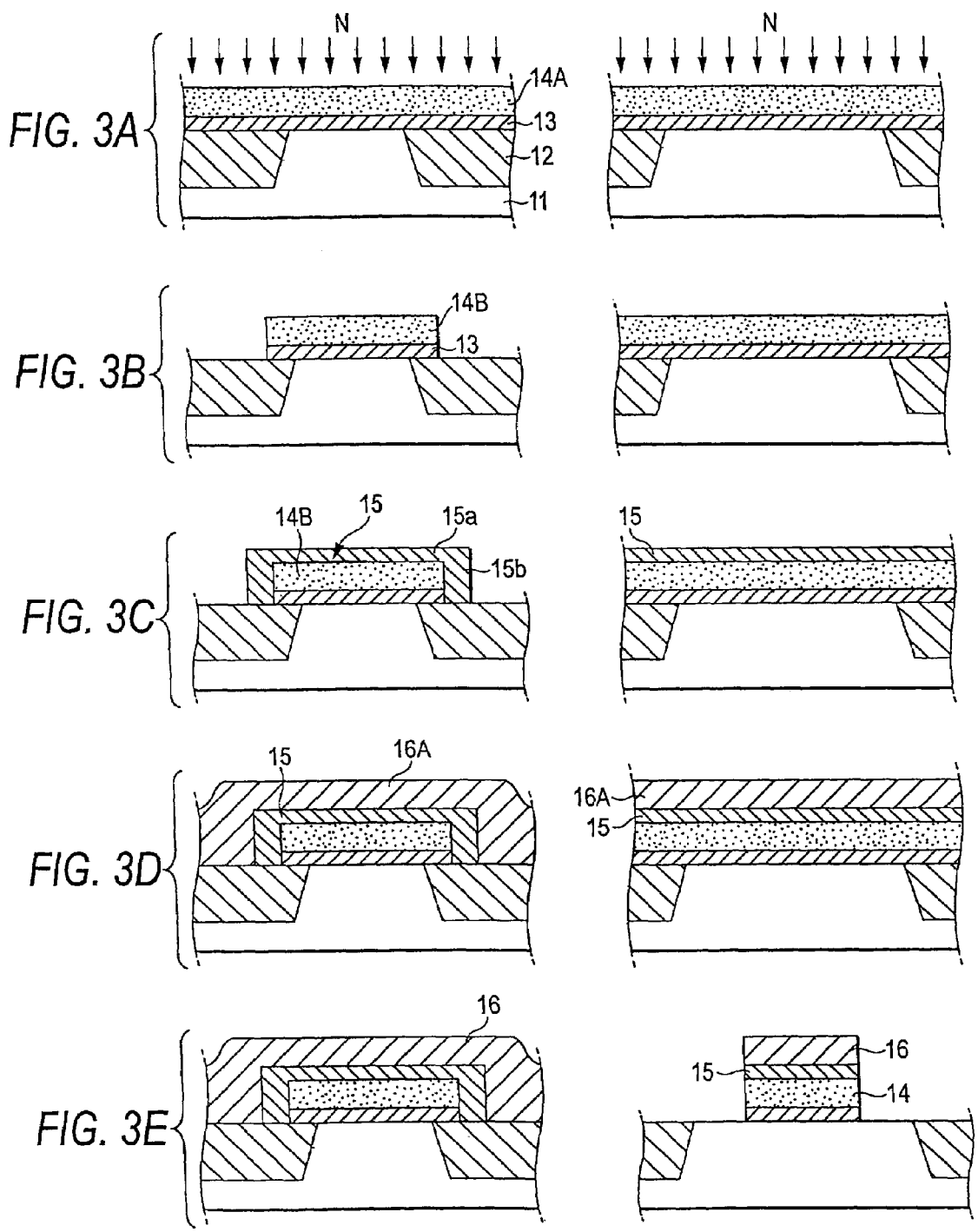

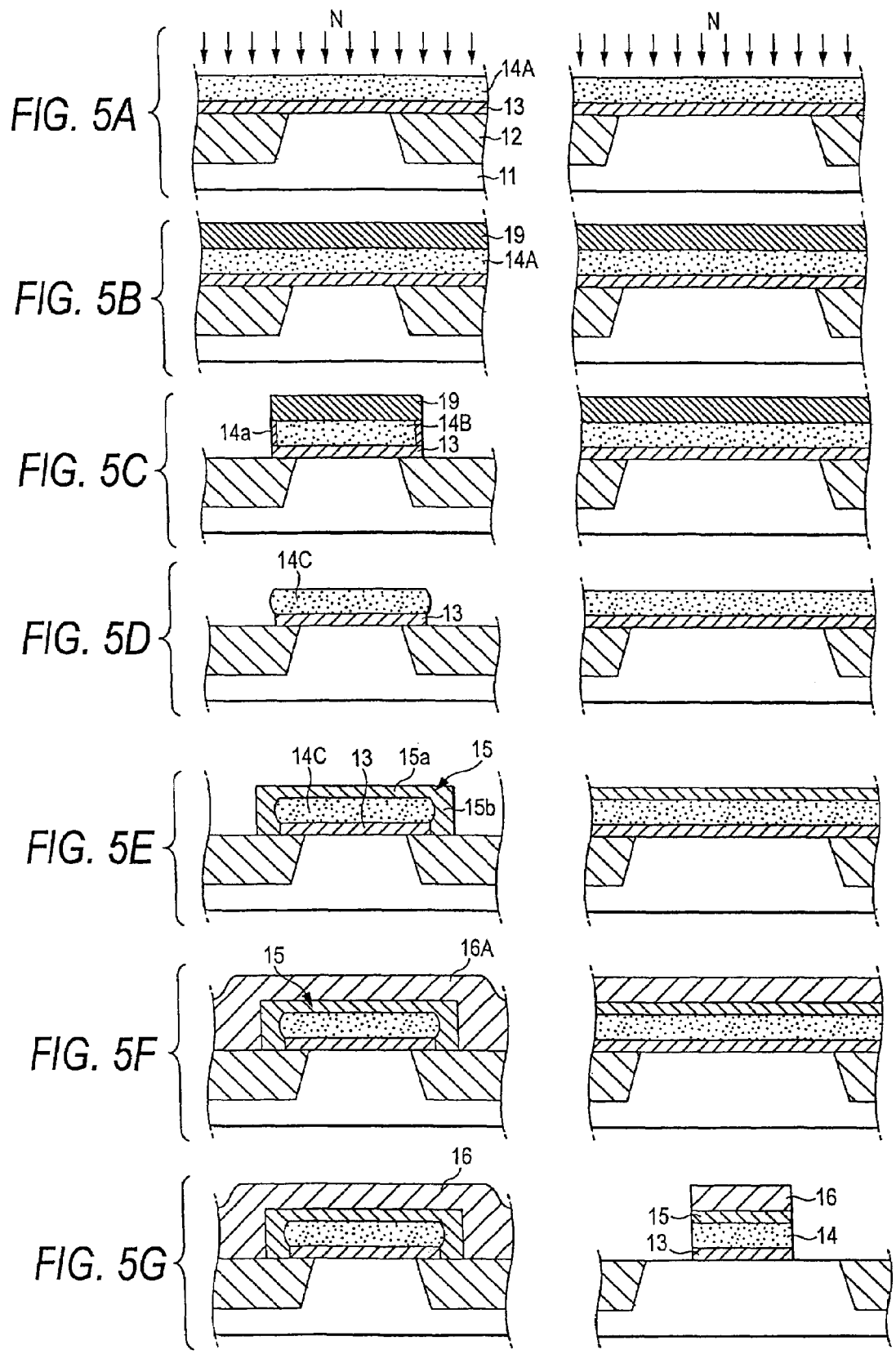

METHOD OF MANUFACTURING NONVOLATILE SEMICONDUCTOR STORAGE DEVICE

BACKGROUND OF THE INVENTION

1. Field of the Invention

The present invention relates to a method of manufacturing a nonvolatile semiconductor storage device having a floating gate, such as a flash memory.

2. Description of the Related Art

Patent Document 1: JP-A-62-131582
Patent Document 2: JP-A-5-175508
Patent Document 3: JP-A-6-188431

FIGS. 2A to C are constructional views of a storage element in a prior-art nonvolatile semiconductor storage device.

The storage element is formed in such a way that the front surface of a semiconductor substrate 1 is divided by an element isolation region 2, and that, on each active region of the semiconductor substrate 1 divided by the element isolation region 2, the layers of a floating gate 4, an inter-gate insulating film 5 and a control gate 6 are successively stacked through a tunnel oxide film 3 being about 10 nm thick and are thereafter patterned. Besides, diffused layers 7, 8 to become a source electrode and a drain electrode are respectively formed in the parts of the active region corresponding to both the sides of the storage element. The storage element is electrically programmed or erased in such a way that a voltage is applied between the control gate 6 and the diffused layers 7, 8 or semiconductor substrate 1, whereby charges are accumulated into the floating gate 4 located therebetween, or charges accumulated in the floating gate 4 are discharged.

In the prior-art storage element, the inter-gate insulating film 5 between the floating gate 4 and the control gate 6 is formed under predetermined conditions, so that the parts of the inter-gate insulating film 5 formed on the front surface and side surfaces of the floating gate 4 come to have substantially equal thicknesses. Accordingly, the part of the inter-gate insulating film 5 corresponding to the edge part of the front surface of the floating gate 4 becomes thinner than the other part, and the potential gradient of the edge part enlarges, to incur the problem that erroneous programming or erroneous erasing occurs or that the retention of the charges is adversely affected.

SUMMARY OF THE INVENTION

The present invention has for its object to provide a method of manufacturing a nonvolatile semiconductor storage device whose electrical programming and erasing are not affected and which is capable of retaining charges for a long time.

A method of manufacturing a nonvolatile semiconductor storage device according to the invention is characterized by sequentially performing the first step of successively forming a first insulating film and a first polysilicon layer on a semiconductor substrate, and implanting nitrogen ions into a front surface of the first polysilicon layer; the second step of patterning the first polysilicon layer and the first insulating film into the shape of a band; the third step of thermally oxidizing the patterned band-shaped first polysilicon layer, thereby to form a second insulating film which is thicker at side surfaces of the first polysilicon layer than at the front surface thereof; the fourth step of forming a second polysilicon layer on a front surface of the resulting semiconductor substrate formed with the second insulating film; and the fifth step of performing patterning so as to form each storage element of the nonvolatile semiconductor storage device as includes the first insulating film, a floating gate electrode made of the first polysilicon layer, the second insulating film, and a control gate electrode made of the second polysilicon layer.

According to the present invention, by way of example, after the front surface of the first polysilicon layer to become the floating gate electrodes has been implanted with the nitrogen ions, the second insulating film is formed by thermally oxidizing the front surface and side surfaces of the first polysilicon layer. Since the nitrogen ions act to suppress the thermal oxidation of polysilicon, the part of the second insulating film formed at the front surface of the floating gate electrode is thinner than the parts thereof formed at the side surfaces of the floating gate electrode. Accordingly, when the part of the second insulating film at the front surface of the floating gate electrode is formed to a predetermined thickness, the parts thereof at the side surfaces can be thickened as desired. Thus, the second insulating film can be prevented from becoming thinner at the edge part of the floating gate electrode than at the other part, thereby to solve the problem that the potential gradient of the edge part enlarges. This brings forth the advantage that a nonvolatile semiconductor storage device whose programming and erasing characteristics are good and which is capable of retaining charges for a long time can be obtained.

The above and other objects and novel features of the invention will be more fully understood from the ensuing description of preferred embodiments when read in conjunction with the accompanying drawings. The drawings, however, are solely for elucidation and shall not restrict the scope of the invention.

BRIEF DESCRIPTION OF THE DRAWINGS

FIGS. 3A to 3E are processing step views showing a method of manufacturing a storage element in FIGS. 1A-1C;

FIGS. 5A to 5G are manufacturing step views of a storage element showing Embodiment 3 of the present invention.

DESCRIPTION OF THE PREFERRED EMBODIMENTS

The present invention will now be described in connection with embodiments.

Embodiment 1

Figure 1A:
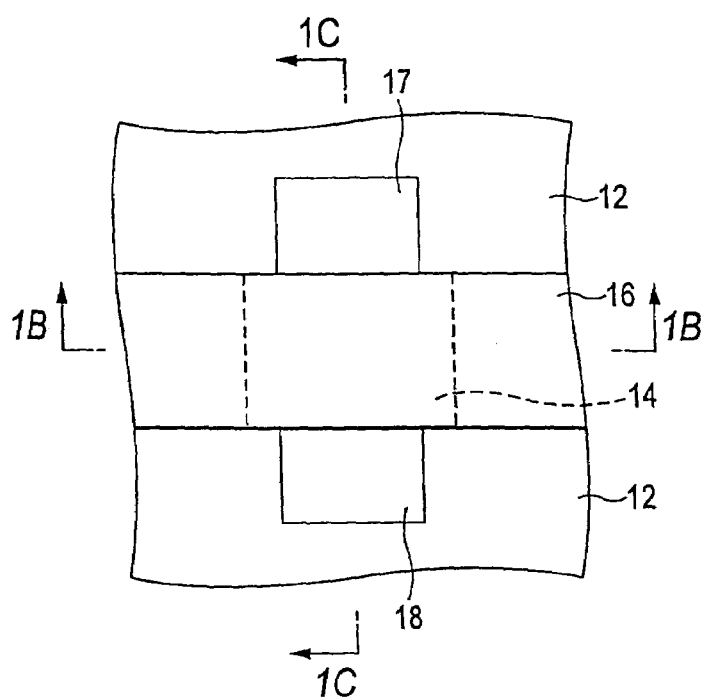
FIGS. 1A, 1B and 1C are constructional views of a storage element in a nonvolatile semiconductor storage device showing Embodiment 1 of the present invention.
Figure 1C:
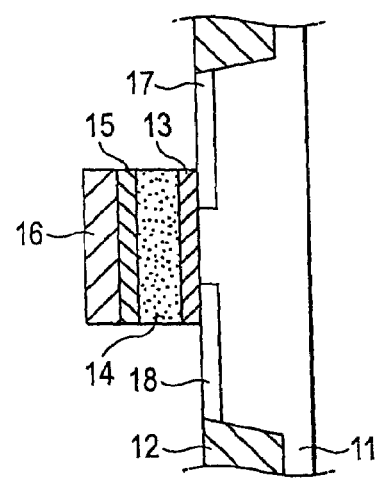
Figure 1B:
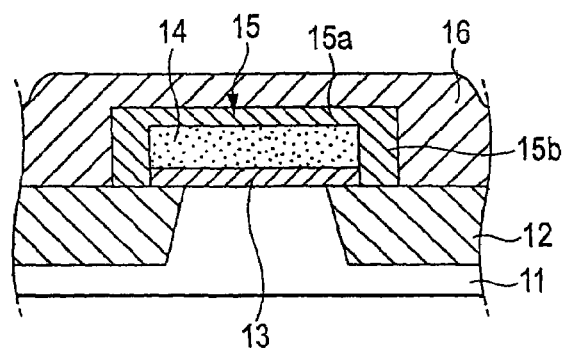
Figure 2A:
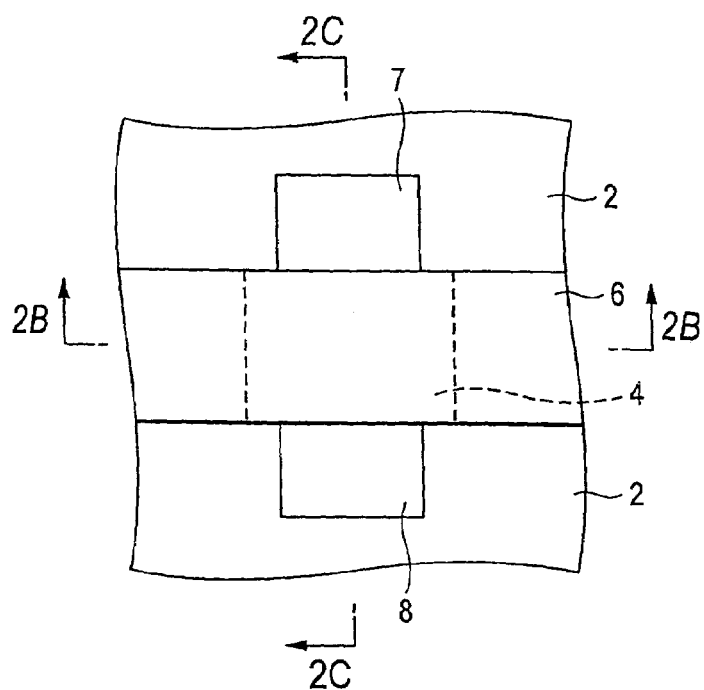
FIGS. 2A, 2B and 2C are constructional views of a storage element in a nonvolatile semiconductor storage device in the prior art.
Figure 2C:
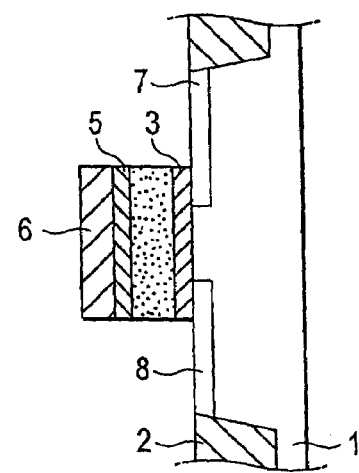
Figure 2B:
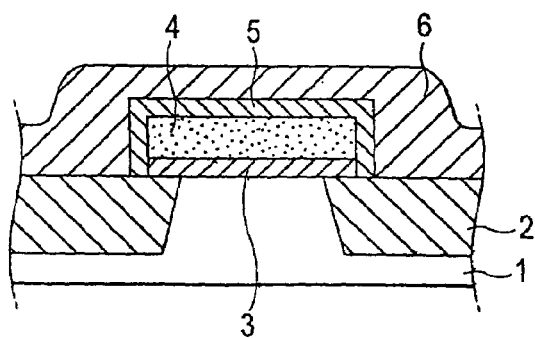

FIGS. 1A to 1C are constructional views of a storage element in a nonvolatile semiconductor storage device showing Embodiment 1 of the present invention. Herein, FIG. 1A is a plan view, and FIGS. 1B and 1C are sectional views showing sections X-X and Y-Y indicated in FIG. 1A, respectively.

The front surface of a semiconductor substrate 11 is divided into active regions by an element isolation region 12 made of a silicon oxide film or the like. On each active region of the semiconductor substrate 11 divided by the element isolation region 12, a floating gate 14 which is made of polysilicon being 20 to 50 nm thick is formed through a tunnel oxide film 13 being 5 to 20 nm thick. Although not shown, nitrogen ions are implanted into the front surface of the floating gate 14 so as to stay in only this front surface.

Besides, an inter-gate insulating film 15 based on thermal oxidation is formed on the front surface of the floating gate 14 and the side surfaces thereof in the direction of the section X-X. The inter-gate insulating film 15 is such that its inter-gate insulating film 15a on the front surface of the floating gate 14 is thinner than each of its inter-gate insulating films 15b on the side surfaces of the floating gate 14. Assuming by way of example that the thickness of the inter-gate insulating film 15a on the front surface be 10 nm, the thickness of each of the inter-gate insulating films 15b on the side surfaces is 12 to 20 nm.

A control gate 16 which is made of polysilicon or the like and which is 80 to 150 nm thick, is formed on the front surface of the inter-gate insulating film 15. Diffused layers 17, 18 to become a source electrode and a drain electrode are respectively formed by ion implantation, in the parts of the active region of the semiconductor substrate 11 corresponding to both the sides of the storage element which includes the tunnel oxide film 13, floating gate 14, inter-gate insulating film 15 and control gate 16 formed on the active region.

FIGS. 3A to 3E are processing step views showing a method of manufacturing the storage element in FIGS. 1A to 1C. Incidentally, the left side of each of FIGS. 3A to 3E corresponds to the section X-X in FIG. 1A, while the right side corresponds to the section Y-Y. Now, the method of manufacturing the storage element in FIGS. 1A to 1C will be described with reference to FIGS. 3A to 3E.

(1) Step 1

As shown in FIG. 3A, an element isolation region 12 is formed of a silicon oxide film or the like in the front surface of a semiconductor substrate 11 by a known technique, and a tunnel oxide film 13 being 5 to 20 nm thick is produced on the front surface of the element isolation region 12 by thermal oxidation or the like. Besides, a polysilicon layer 14A which is 20 to 50 nm thick and which is to become floating gates 14 through patterning later is formed on the front surface of the tunnel oxide film 13. Thereafter, nitrogen ions (N) are implanted into the front surface of the polysilicon layer 14A so as to stay in only this front surface. The implantation conditions of the nitrogen ions on this occasion are an acceleration voltage of 5 to 10 keV and a dose of $1 \times 10^{19}$ to $5 \times 10^{20}$ ions/cm$^2$.

(2) Step 2

The polysilicon layer 14A and the tunnel oxide film 13 are patterned into the shape of a band in the vertical direction (Y-Y direction) in FIG. 1A, by employing known photolithography. Thus, as shown in FIG. 3B, a polysilicon layer 14B and a tunnel oxide film 13 which are in the shape of the band are formed so that the band may lie astride the active regions of the semiconductor substrate 11 with both its ends held on the element isolation region 12.

(3) Step 3

The surfaces of the band-shaped polysilicon layer 14B and tunnel oxide film 13 formed by the patterning are oxidized by thermal oxidation, thereby to produce an inter-gate insulating film 15. On this occasion, since the front surface of the polysilicon layer 14B has been implanted with the nitrogen ions, the growth of the oxide film is slower at the front surface of the polysilicon layer 14B than at the side surfaces thereof where no nitrogen ions exist. Thus, as shown in FIG. 3C, an inter-gate insulating film 15a being about 10 nm thick is formed at the front surface of the polysilicon layer 14B, and inter-gate insulating films 15b each being about 12 to 20 nm thick are formed at the side surfaces of the polysilicon layer 14B and the tunnel oxide film 13.

(4) Step 4

As shown in FIG. 3D, a polysilicon layer 16A which is 80 to 150 nm thick and which is to become control gates 16 through patterning later is formed on the front surface of the semiconductor substrate 11 formed with the inter-gate insulating film 15.

(5) Step 5

In order to separate the polysilicon layer 14B continuous in the vertical direction in FIG. 1A, into the individual floating gates 14, the polysilicon layer 16A, inter-gate insulating film 15, polysilicon layer 14B and tunnel oxide film 13 are patterned into the shape of a band in the lateral direction (X-X direction) in FIG. 1A, by employing known photolithography. Thus, as shown on the right side in FIG. 3E, the storage element in which the tunnel oxide film 13, floating gate 14, inter-gate insulating film 15 and control gate 16 are successively stacked is formed on each active region of the semiconductor substrate 11.

Thereafter, diffused layers 17, 18 to become a source electrode and a drain electrode are respectively formed in the parts of the front surface of the semiconductor substrate 11 corresponding to both the sides of each storage element, by ion diffusion. Thus, the storage element in the nonvolatile semiconductor storage device as shown in FIGS. 1A to 1C is finished up.

As described above, according to the storage element of Embodiment 1, the nitrogen ions are implanted into the front surface of the polysilicon layer 14A to become the floating gates 14, so as to stay in only this front surface, the polysilicon layer 14A is thereafter patterned, and the front surface and side surfaces of the patterned polysilicon layer are further oxidized by thermal oxidation at the same time. Thus, the inter-gate insulating films 15b at the side surfaces of the floating gate 14 can be formed thicker than the inter-gate insulating film 15a at the front surface thereof implanted with the nitrogen ions. Accordingly, the inter-gate insulating film 15 at the edge part of the floating gate 14 does not become thinner than at the other part, and the potential gradient of the edge part becomes just a design value, thereby to solve the problem that erroneous programming or erroneous erasing occurs or that the retention of charges is adversely affected.

Embodiment 2

FIGS. 4A to 4F are manufacturing step views of a storage element showing Embodiment 2 of the present invention. Incidentally, the left side of each of FIGS. 4A to 4F corresponds to the section X-X in FIG. 1A, while the right side corresponds to the section Y-Y. Besides, common numerals and signs are respectively assigned to constituents common to the constituents in FIGS. 1A to 1C and FIGS. 3A to 3E.

(1) Step 1

Figures 4A, 4B, 4C, 4D, 4E, 4F:
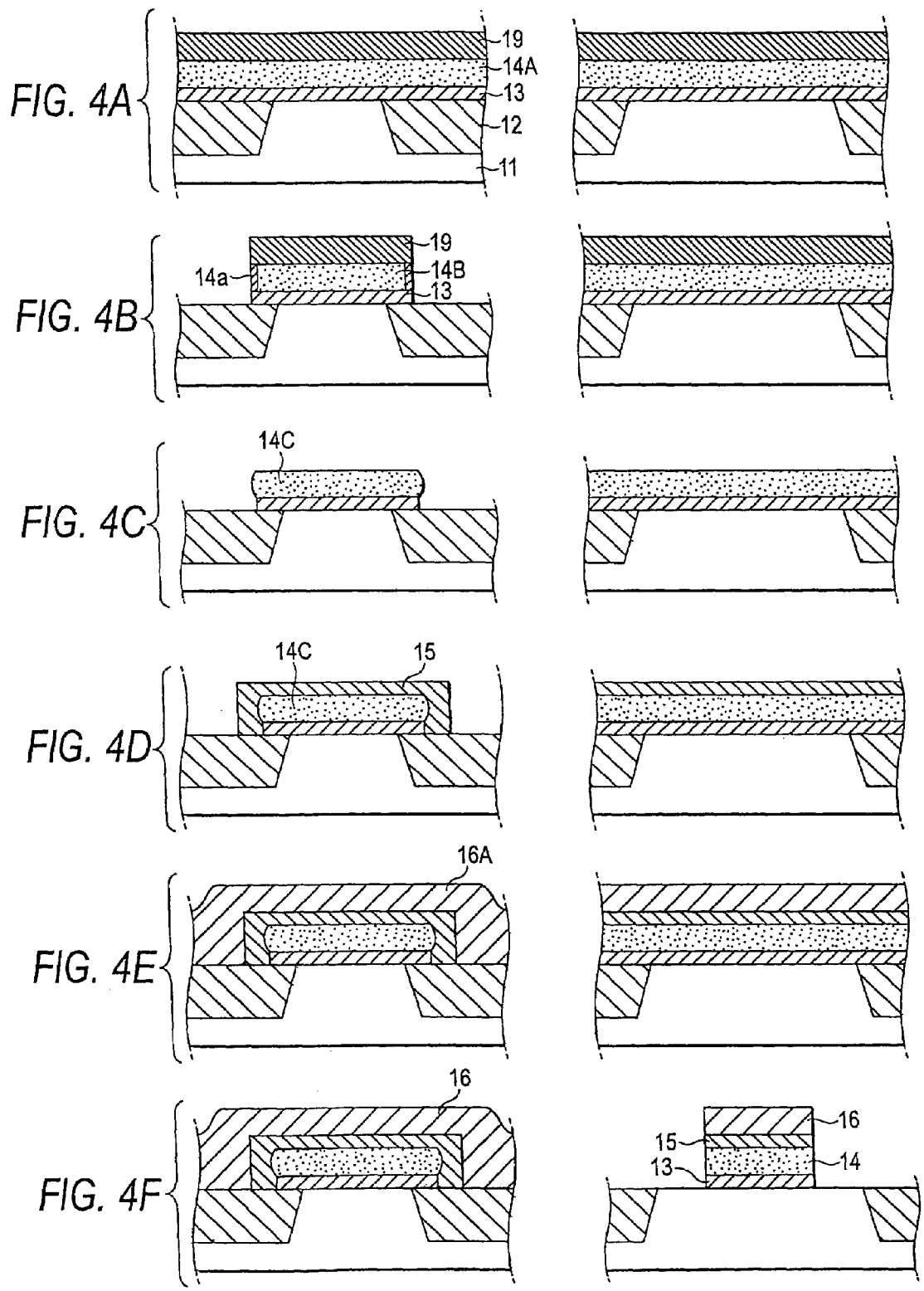
FIGS. 4A to 4F are manufacturing step views of a storage element showing Embodiment 2 of the present invention.

As shown in FIG. 4A, an element isolation region 12, a tunnel oxide film 13 and a polysilicon layer 14A are successively stacked and formed on the front surface of a semiconductor substrate 11, and a silicon nitride film 19 being 50 to 100 nm thick is thereafter formed on the front surface of the polysilicon layer 14A.

(2) Step 2

The silicon nitride film 19, polysilicon layer 14A and tunnel oxide film 13 are patterned into the shape of a band in the Y-Y direction in FIG. 1A. Then, a silicon nitride film 19, a polysilicon layer 14B and a tunnel oxide film 13 which are in the shape of the band are formed so that the band may lie astride the active regions of the semiconductor substrate 11 with both its ends held on the element isolation region 12. Further, oxide films 14a each being about 10 nm thick are produced on the side surfaces of the polysilicon layer 14B by performing thermal oxidation at, for example, 900° C. Thus, the band-shaped polysilicon layer 14B formed with the oxide films 14a at its side surfaces is obtained as shown in FIG. 4B.

(3) Step 3

The silicon nitride film 19 is removed with hot phosphoric acid, and the oxide films 14a at the side surfaces of the polysilicon layer 14B are further removed with hydrofluoric acid. On this occasion, the edge part of the polysilicon layer 14B has been more oxidized by the thermal oxidation at the step 2. Therefore, when the oxide films 14a have been removed, a polysilicon layer 14C whose edge part is rounded and which has a curved surface is obtained as shown in FIG. 4C.

(4) Step 4

The surfaces of the band-shaped polysilicon layer 14C whose edge part has become the curved surface, and the band-shaped tunnel oxide film 13 are oxidized by thermal oxidation, thereby to produce an inter-gate insulating film 15. Thus, as shown in FIG. 4D, the inter-gate insulating film 15 being about 10 nm thick is formed on each of the front surface and side surfaces of the polysilicon layer 14C and the side surfaces of the tunnel oxide film 13.

(5) Step 5

As shown in FIG. 4E, a polysilicon layer 16A which is 80 to 150 nm thick and which is to become control gates 16 through patterning later is formed on the front surface of the semiconductor substrate 11 formed with the inter-gate insulating film 15.

(6) Step 6

In order to separate the polysilicon layer 14C continuous in the vertical direction in FIG. 1A, into the individual floating gates 14, the polysilicon layer 16A, inter-gate insulating film 15, polysilicon layer 14C and tunnel oxide film 13 are patterned into the shape of a band in the lateral direction. Thus, as shown on the right side in FIG. 4F, the storage element in which the tunnel oxide film 13, floating gate 14, inter-gate insulating film 15 and control gate 16 are successively stacked is formed on each active region of the semiconductor substrate 11.

Thereafter, diffused layers 17, 18 to become a source electrode and a drain electrode are respectively formed in the parts of the front surface of the semiconductor substrate 11 corresponding to both the sides of each storage element, by ion diffusion. Thus, the storage element in the nonvolatile semiconductor storage device as shown in FIGS. 1A to 1C is finished up.

As described above, according to the storage element of Embodiment 2, the silicon nitride film 19 is formed on the front surface of the polysilicon layer 14A to become the floating gates 14, the polysilicon layer 14A is thereafter patterned, and the side surfaces of the patterned polysilicon layer are thermally oxidized so as to form the oxide films 14a. Thus, the polysilicon layer 14C (for the floating gates) whose edge part has become the curved surface is obtained after removing the silicon nitride film 19 and the oxide films 14a. Therefore, the inter-gate insulating film 15 at the edge part of each floating gate 14 does not become thinner than at the other part, and the same advantage as in Embodiment 1 can be attained.

Embodiment 3

FIGS. 5A to 5G are manufacturing step views of a storage element showing Embodiment 3 of the present invention. Incidentally, the left side of each of FIGS. 5A to 5G corresponds to the section X-X in FIG. 1A, while the right side corresponds to the section Y-Y. Besides, common numerals and signs are respectively assigned to constituents common to the constituents in FIGS. 4A to 4F.

(1) Step 1

As shown in FIG. 5A, an element isolation region 12, a tunnel oxide film 13 and a polysilicon layer 14A are successively stacked and formed on the front surface of a semiconductor substrate 11, and nitrogen ions are thereafter implanted into the front surface of the polysilicon layer 14A. This step is the same as Step 1 of Embodiment 1.

(2) Step 2

As shown in FIG. 5B, a silicon nitride film 19 being 50 to 100 nm thick is formed on the front surface of the polysilicon layer 14A implanted with the nitrogen ions.

(3) Step 3

The silicon nitride film 19, polysilicon layer 14A and tunnel oxide film 13 are patterned into the shape of a band in the Y-Y direction in FIG. 1A. Thus, a silicon nitride film 19, a polysilicon layer 14B and a tunnel oxide film 13 which are in the shape of the band are formed so that the band may lie astride the active regions of the semiconductor substrate 11 with both its ends held on the element isolation region 12. Further, oxide films 14a each being about 10 nm thick are produced on the side surfaces of the polysilicon layer 14B by thermal oxidation. In this way, a band-shaped storage element portion formed with the oxide films 14a at the side surfaces of the polysilicon layer 14B is obtained as shown in FIG. 5C. This step is the same as Step 2 of Embodiment 2.

(4) Step 4

The silicon nitride film 19, and the oxide films 14a at the side surfaces of the polysilicon layer 14B are removed in the same manner as at Step 3 of Embodiment 2. Thus, a polysilicon layer 14C whose edge part is rounded and which has a curved surface is obtained as shown in FIG. 5D.

(5) Step 5

The front surface and side surfaces of the band-shaped polysilicon layer 14C whose edge part has become the curved surface, and the side surfaces of the band-shaped tunnel oxide film 13 are oxidized by thermal oxidation, thereby to produce an inter-gate insulating film 15. On this occasion, since the front surface of the polysilicon layer 14C has been implanted with the nitrogen ions by Step 1 beforehand, the growth of the oxide film is slower at the front surface of the polysilicon layer 14C than at the side surfaces thereof where no nitrogen ions exist. Thus, as shown in FIG. 5E, an inter-gate insulating film 15a being about 10 nm thick is formed at the front surface of the polysilicon layer 14C, and inter-gate insulating films 15b each being about 12 to 20 nm thick are formed on the side surfaces of the polysilicon layer 14C and the tunnel oxide film 13.

(6) Step 6

As shown in FIG. 5F, a polysilicon layer 16A which is 80 to 150 nm thick and which is to become control gates 16 through patterning later is formed on the front surface of the semiconductor substrate 11 formed with the inter-gate insulating film 15.

(7) Step 7

In order to separate the polysilicon layer 14C into the individual floating gates 14, the polysilicon layer 16A, inter-gate insulating film 15, polysilicon layer 14C and tunnel oxide film 13 are patterned into the shape of a band in the lateral direction in FIG. 1A. Thus, as shown on the right side in FIG. 5G, the storage element in which the tunnel oxide film 13, floating gate 14, inter-gate insulating film 15 and control gate 16 are successively stacked is formed on each active region of the semiconductor substrate 11.

Thereafter, diffused layers 17, 18 to become a source electrode and a drain electrode are respectively formed in the parts of the front surface of the semiconductor substrate 11 corresponding to both the sides of each storage element, by ion diffusion. Thus, the storage element in the nonvolatile semiconductor storage device as shown in FIGS. 1A to 1C is finished up.

As described above, according to the storage element of Embodiment 3, the nitrogen ions are previously implanted into the front surface of the polysilicon layer 14A to become the floating gates 14, and the polysilicon layer 14A is thereafter processed by the same steps as in Embodiment 2. Accordingly, the polysilicon layer 14C (for the floating gates) whose edge part has become the curved surface is obtained, and the inter-gate insulating film 15b at each of the side surfaces of the polysilicon layer 14C can be formed thicker than the inter-gate insulating film 15a at the front surface of the polysilicon layer 14C. Thus, the same advantage as in Embodiment 1 can be attained more reliably.

Incidentally, the embodiments described above serve to reveal the technical contents of the present invention, to the last. The invention shall not be narrowly construed as being restricted to the foregoing embodiments only, but it can be carried out in various modifications within a scope defined by the claims of the invention. The modifications include, for example, the following:

(a) The order of Step 1 and Step 2 in Embodiment 1 may well be reversed so as to initially pattern a polysilicon layer 14A and a tunnel oxide film 13 and to subsequently implant nitrogen ions into the front surface of the patterned polysilicon layer.

(b) The thicknesses of films, materials for use, etc. are not restricted to the exemplified ones.

By way of example, the present invention is applicable to semiconductor manufacturing industries.

What is claimed is:

1. A method of manufacturing a nonvolatile semiconductor storage device, comprising:

a first step of successively forming a first insulating film and a first polysilicon layer on a semiconductor substrate, and implanting nitrogen ions into a front surface of the first polysilicon layer;

a second step of patterning the first polysilicon layer and the first insulating film into the shape of a band;

a third step of thermally oxidizing the patterned band-shaped first polysilicon layer, thereby to form a second insulating film which is thicker at side surfaces of the first polysilicon layer than at the front surface thereof;

a fourth step of forming a second polysilicon layer on a front surface of the semiconductor substrate formed with the second insulating film; and a fifth step of performing patterning so as to form each storage element of the nonvolatile semiconductor storage device as including the first insulating film, a floating gate electrode made of the first polysilicon layer, the second insulating film, and a control gate electrode made of the second polysilicon layer.

2. The method of manufacturing a nonvolatile semiconductor storage device of claim 1, wherein the first polysilicon layer has a thickness of 20 to 50 nm, and the nitrogen ions are implanted with an acceleration voltage of 5 to 10 keV and a dose of $1 \times 10^{19}$ to $5 \times 10^{20}$ ions/cm$^2$.

3. A method of manufacturing a semiconductor device comprising:

forming a first insulating film and a first polysilicon layer in sequence on a semiconductor substrate;

implanting nitrogen ions into a front surface of the first polysilicon layer;

patterning the first insulating film and the first polysilicon layer to form a band-shaped segment thereof on the semiconductor substrate;

thermally oxidizing the band-shaped segment to simultaneously grow a second insulating film on side surfaces and the front surface of the first polysilicon layer, wherein the second insulating film is grown thicker on the side surfaces of the first polysilicon layer than on the front surface of the polysilicon layer implanted with nitrogen ions; and forming a second polysilicon layer on a front surface of the thermally oxidized band-shaped segment, wherein said implanting nitrogen ions is performed prior to said patterning the first insulating film and the first polysilicon layer.

4. The method of manufacturing a semiconductor device of claim 3, further comprising:

patterning the thermally oxidized band-shaped segment having the second polysilicon layer thereon, to form a non-volatile semiconductor storage element including the first insulating film, a floating gate electrode made of the first polysilicon layer, the second insulating film, and a control electrode made of the second polysilicon layer.

5. The method of manufacturing a semiconductor device of claim 3, wherein the first polysilicon layer has a thickness of 20 to 50 nm, and the nitrogen ions are implanted with an acceleration voltage of 5 to 10 keV and a dose of $1 \times 10^{19}$ to $5 \times 10^{20}$ ions/cm$^2$.

* * * * *